(12) United States Patent
Kano

(10) Patent No.: US 11,901,868 B2
(45) Date of Patent: Feb. 13, 2024

(54) AMPLIFIER CIRCUIT, ADDER CIRCUIT, RECEPTION CIRCUIT, AND INTEGRATED CIRCUIT

(71) Applicant: SOCIONEXT INC., Kanagawa (JP)

(72) Inventor: Hideki Kano, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 821 days.

(21) Appl. No.: 16/986,931

(22) Filed: Aug. 6, 2020

(65) Prior Publication Data
US 2020/0382086 A1 Dec. 3, 2020

Related U.S. Application Data

(63) Continuation of application No. PCT/JP2018/004457, filed on Feb. 8, 2018.

(51) Int. Cl.
*H03F 3/45* (2006.01)
*H04L 25/49* (2006.01)
*G06F 7/50* (2006.01)

(52) U.S. Cl.
CPC ..... *H03F 3/45179* (2013.01); *H04L 25/4917* (2013.01); *G06F 7/50* (2013.01)

(58) Field of Classification Search
CPC ........... H03F 3/45179; H03F 2200/513; H03F 1/0205; H03F 1/086; H03F 1/3211; H03F 2203/45316; H03F 3/45192; H03F 3/45; H03F 3/45183; H03F 3/45089; H03F 3/3022; H04L 25/4917; H04L 25/03878; G06F 7/50

(Continued)

(56) References Cited

U.S. PATENT DOCUMENTS 7,301,401 B2 11/2007 Pennock
7,848,724 B2 12/2010 Bult et al.
(Continued)

FOREIGN PATENT DOCUMENTS

CN 102780663 A 11/2012
CN 105187342 A 12/2015
(Continued)

OTHER PUBLICATIONS

Japanese Notice of Reasons for Refusal, issued in Japanese Patent Application 2019-570225 dated Oct. 5, 2021; with English translation.

(Continued)

*Primary Examiner* — Khanh V Nguyen
(74) *Attorney, Agent, or Firm* — Rimon, P.C.

(57) ABSTRACT

There are an amplifier circuit which includes a first current source that is connected to a power supply line to which a first electric potential is supplied, a differential input circuit that is connected between the first current source and a first node and configured to receive a differential input signal, a second current source that is connected between a power supply line to which a second electric potential is supplied and the first node, and a load circuit that is connected between a power supply line to which the first electric potential is supplied and a second node, and an inductor circuit is further connected between the first node and the second node. Thereby, the amplifier circuit achieves both lower voltage and linearity.

26 Claims, 11 Drawing Sheets

(58) Field of Classification Search
USPC .................................................. 330/253, 255
See application file for complete search history.

(56) References Cited

U.S. PATENT DOCUMENTS

| | | |
|---|---|---|
| 8,264,278 B2 | 9/2012 | Kanda et al. |
| 8,872,586 B2 | 10/2014 | Hsieh |
| 8,896,352 B2* | 11/2014 | Huang .................. H03H 11/44 327/108 |
| 9,025,971 B2 | 5/2015 | Ide |
| 9,082,543 B2 | 7/2015 | Ohtomo et al. |
| 2005/0088233 A1* | 4/2005 | Miyashita ........... H03F 3/45085 330/252 |
| 2009/0232196 A1 | 9/2009 | Sunaga et al. |
| 2010/0253436 A1 | 10/2010 | Kanda et al. |
| 2012/0098572 A1* | 4/2012 | Tripathi ............... H03K 5/2481 327/65 |
| 2013/0121356 A1* | 5/2013 | Sugawara ............. H05B 45/10 315/172 |
| 2014/0193164 A1 | 7/2014 | Ide |
| 2015/0035625 A1 | 2/2015 | Ohtomo et al. |
| 2015/0311932 A1 | 10/2015 | Fujii |

FOREIGN PATENT DOCUMENTS

| | | |
|---|---|---|
| JP | H10-209537 A | 8/1998 |
| JP | 2009-225018 A | 10/2009 |
| JP | 2013-106010 A | 5/2013 |
| JP | 2014-135646 A | 7/2014 |
| JP | 2015-211270 A | 11/2015 |
| JP | 2016-139976 A | 8/2016 |
| WO | 2009/025008 A1 | 2/2009 |
| WO | 2012/036207 A1 | 3/2012 |

OTHER PUBLICATIONS

International Search Report and Written Opinion issued in International Patent Patent Application No. PCT/JP2018/004457, dated May 1, 2018; with partial English translation.

Notice of Reasons for Refusal dated Apr. 12, 2022 issued in the corresponding Japanese Patent Application No. 2019-570225, with English translation.

\* cited by examiner

F I G. 1
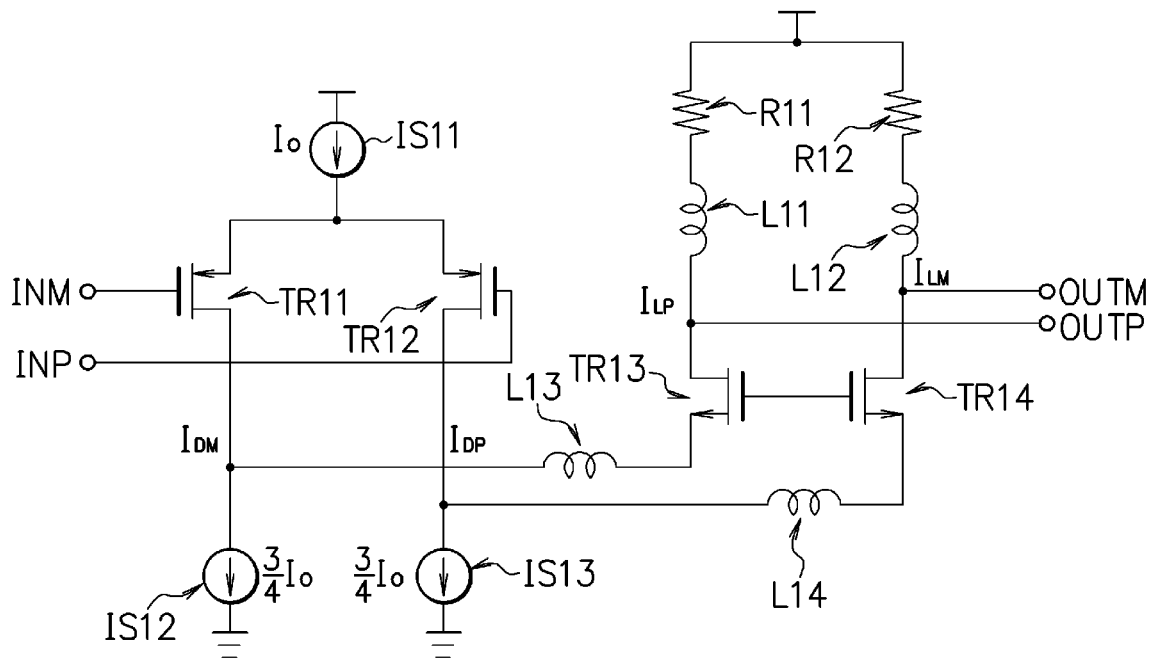
F I G. 2
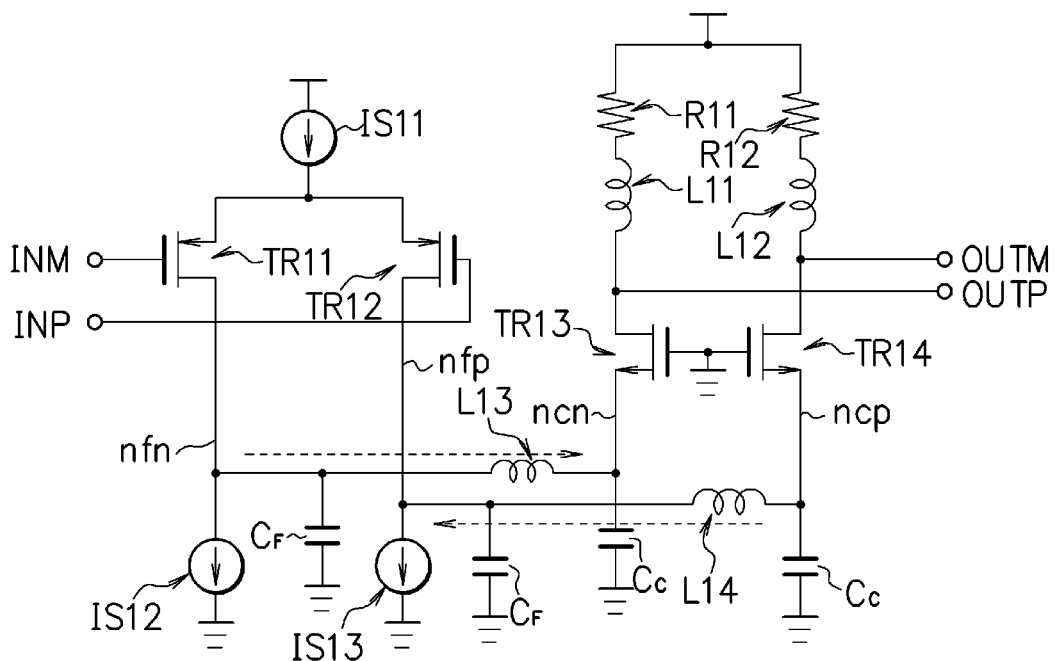

F I G. 5
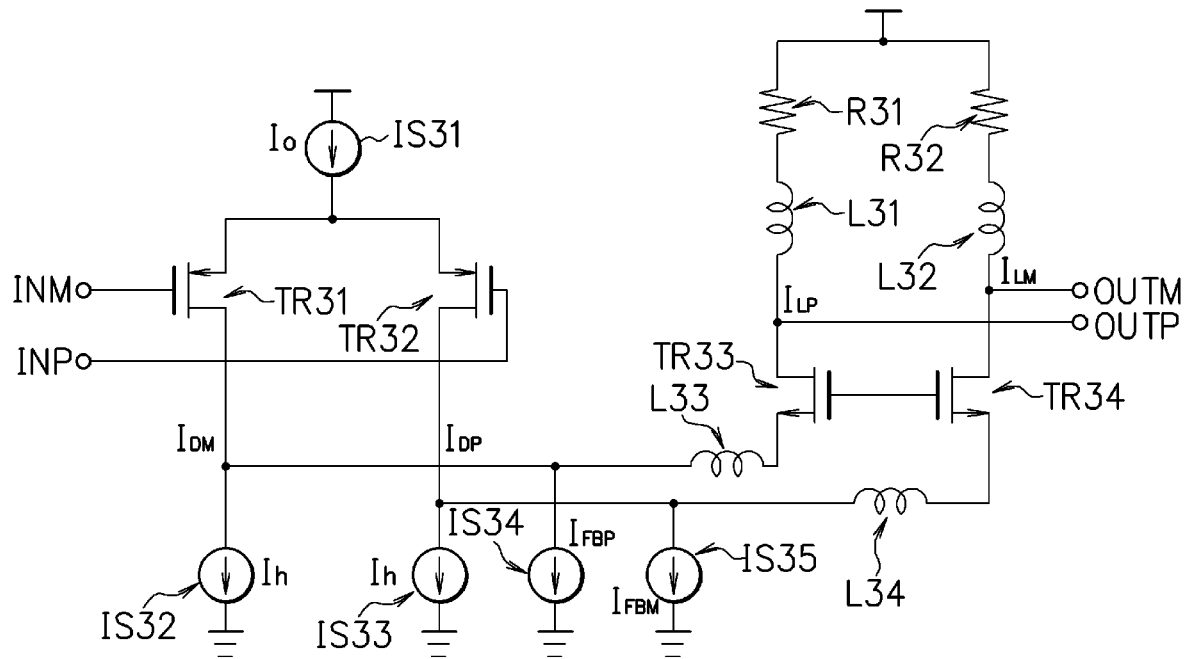
F I G. 6
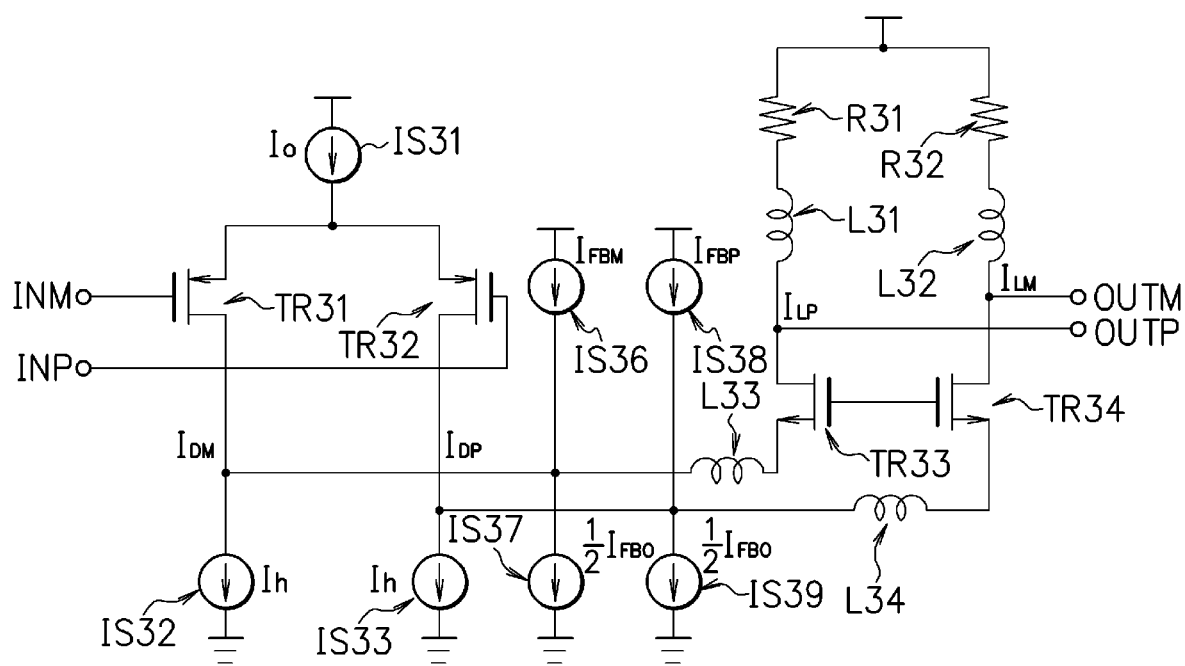

Main amp.

Feedback amp.

Main−Feedback gm STAGE HPF

LOAD RESISTOR·CAPACITOR LPF gm STAGE HPF · LOAD LPF

F I G. 12
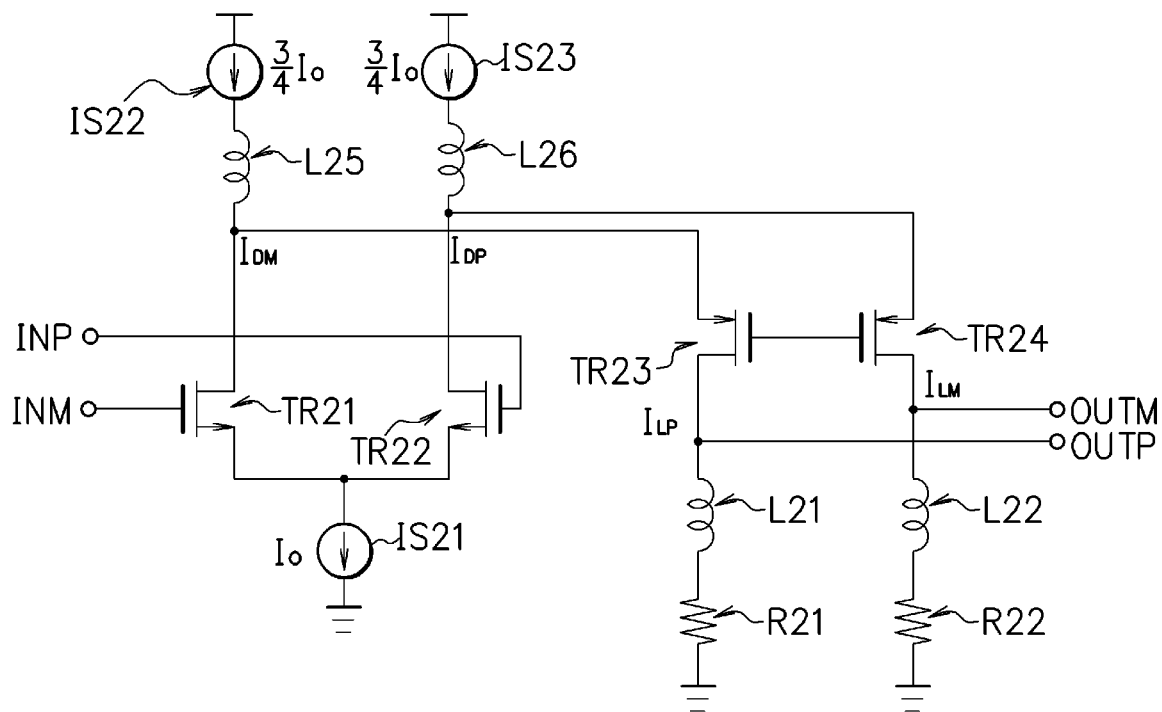
F I G. 13
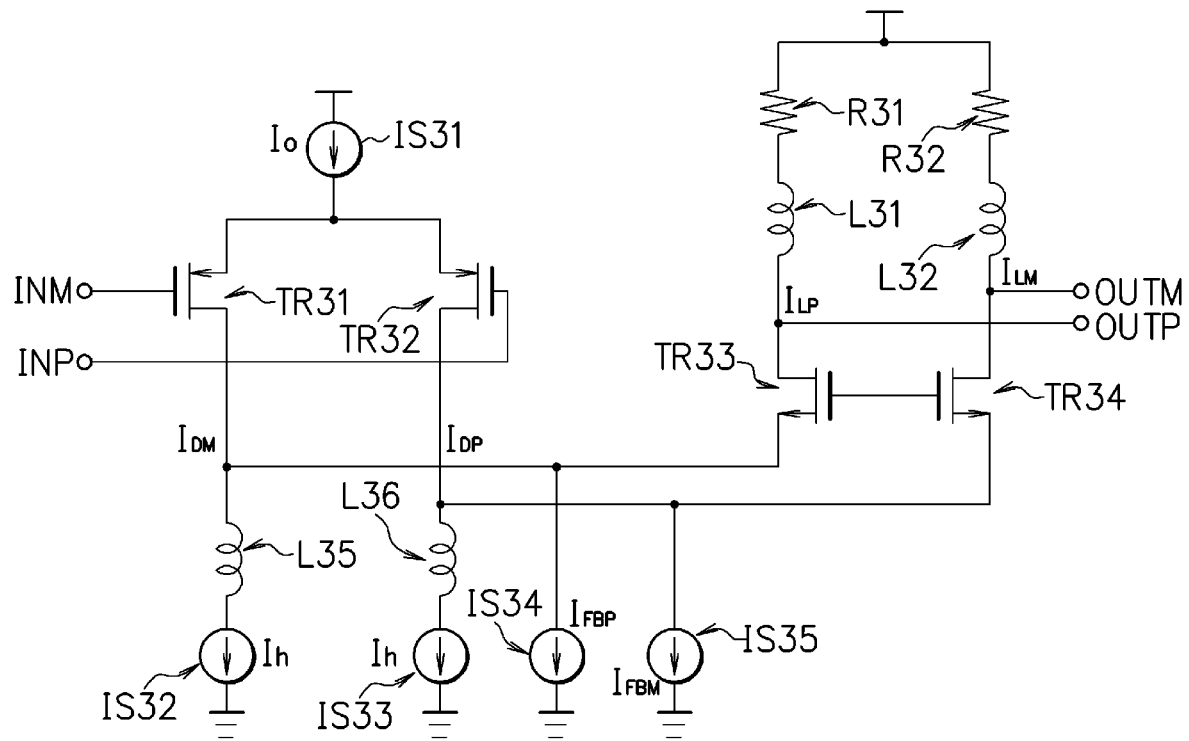

AMPLIFIER CIRCUIT, ADDER CIRCUIT, RECEPTION CIRCUIT, AND INTEGRATED CIRCUIT

CROSS-REFERENCE TO RELATED APPLICATION

This application is a continuation application of International Application PCT/JP2018/004457 filed on Feb. 8, 2018, and designated the U.S., the entire contents of which are incorporated herein by reference.

FIELD

The embodiments discussed herein are directed to an amplifier circuit, an adder circuit, a reception circuit, and an integrated circuit.

BACKGROUND

At a front end unit or the like of a reception circuit of a de-serializer in a Serializer/De-serializer (SerDes), an amplifier circuit and an adder circuit using differential pairs have been used. In these amplifier circuit and adder circuit, lower voltage of a power supply voltage achieved by miniaturization of a CMOS technology or the like has been in progress. Further, there is a circuit that transmits and receives not a binary NRZ (Non-Return Zero) signal but a quaternary pulse amplitude modulation signal called PAM4 (Pulse Amplitude Modulation 4) for multileveled signal amplitude levels. In terms of the quaternary PAM4 signal, the intervals between signal amplitude levels corresponding to respective values are desired to be equal.

However, when transistors of a differential pair in the amplifier circuit have nonlinearity in the reception circuit that receives the PAM4 signal, the gain is suppressed and the signal amplitude is reduced in the case of the signal amplitude level being a large value of "00b" (b indicates binary notation) or being a value of "11b." Thereby, the size of an eye opening in the PAM4 signal changes, so that high linearity is needed for the gain characteristic in the amplifier circuit of the reception circuit, in order to obtain good reception accuracy. In order to expand the region where the gain characteristic exhibits linearity, it is necessary to increase the power supply voltage. Further, in order to widen the output voltage range, increasing a load resistance and a constant current in the amplifier circuit is considered, but in the case of an Nch differential pair, an output common voltage may decrease and transistors may stop operating, so that it is necessary to increase the power supply voltage.

[Patent Document 1] U.S. Pat. No. 8,872,586
[Patent Document 2] U.S. Pat. No. 7,848,724
[Patent Document 3] U.S. Pat. No. 7,301,401

SUMMARY

One aspect of an amplifier circuit includes: a first current source that is connected to a power supply line to which a first electric potential is supplied; a differential input circuit that is connected between the first current source and a first node and configured to receive a differential input signal; a second current source that is connected between a power supply line to which a second electric potential different from the first electric potential is supplied and the first node; a load circuit that is connected between a power supply line to which the first electric potential is supplied and a second node; and an inductor circuit that is connected between the first node and the second node.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of an amplifier circuit in an embodiment;
FIG. 2 is a diagram explaining an operation of the amplifier circuit in this embodiment;
FIG. 5 is a diagram illustrating a configuration example of an adder circuit in this embodiment;
FIG. 6 is a diagram illustrating another configuration example of the adder circuit in this embodiment;
FIG. 12 is a diagram illustrating another configuration example of the amplifier circuit in this embodiment;
FIG. 13 is a diagram illustrating another configuration example of the adder circuit in this embodiment.

DESCRIPTION OF EMBODIMENTS

Figure 3:
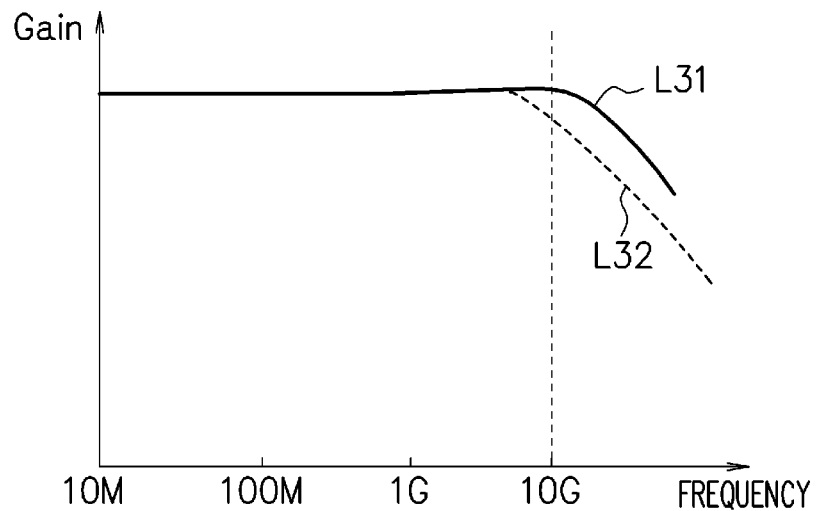
FIG. 3 is a view illustrating an example of a gain characteristic of the amplifier circuit in this embodiment.

Hereinafter, the embodiments will be explained based on the drawings.

An amplifier circuit in one embodiment is explained. FIG. 1 is a diagram illustrating a configuration example of the amplifier circuit in this embodiment. The amplifier circuit in this embodiment is a folded cascode amplifier circuit. The amplifier circuit in this embodiment includes: P-channel-type transistors TR11, TR12; N-channel-type transistors TR13, TR14; current sources IS11, IS12, and IS13; resistors R11, R12; and inductors L11, L12, L13, and L14.

The P-channel-type transistor TR11 has a source thereof connected to the current source IS11, has a gate thereof connected to an input terminal to which one signal INM of differential input signals is input, and has a drain thereof connected to the current source IS12. Further, the P-channel-type transistor TR12 has a source thereof connected to the current source IS11, has a gate thereof connected to an input terminal to which the other signal INP of the differential input signals is input, and has a drain thereof connected to the current source IS13.

The current source IS11 is a current source with a current amount $I_0$ and is connected to a power supply line to which a first electric potential (a high-electric potential VDD in a power supply voltage) is supplied. Further, the current sources IS12, IS13 each are a current source with a current amount $(¾)I_0$, for example, and each are connected to a power supply line to which a second electric potential (a low-electric potential VSS in the power supply voltage) is supplied. The current sources IS11, IS12, and IS13 each are fabricated by an MOS transistor, for example.

The resistor R11 is a load resistor, and has one end thereof connected to a power supply line to which the first electric potential (high-electric potential VDD in the power supply voltage) is supplied and has the other end thereof connected to a drain of the N-channel-type transistor TR13 via the inductor L11. Further, the resistor R12 is a load resistor, and has one end thereof connected to the power supply line to which the first electric potential (high-electric potential VDD in the power supply voltage) is supplied and has the other end thereof connected to a drain of the N-channel-type transistor TR14 via the inductor L12.

A connection point (output node) between the inductor L11 and the drain of the N-channel-type transistor TR13 is connected to an output terminal from which one signal OUTP of differential output signals is output. Further, a connection point (output node) between the inductor L12 and the drain of the N-channel-type transistor TR14 is connected to an output terminal from which the other signal OUTM of the differential output signals is output. Incidentally, a bias voltage, which is ground in terms of AC (alternating current) but has a predetermined value in terms of DC (direct current), is applied to the gates of the N-channel-type transistors TR13, TR14.

The inductor L13 has one end thereof connected to a connection point (folded node) between the P-channel-type transistor TR11 and the current source IS12 and has the other end thereof connected to a source of the N-channel-type transistor TR13. Further, the inductor L14 has one end thereof connected to a connection point (folded node) between the P-channel-type transistor TR12 and the current source IS13 and has the other end thereof connected to a source of the N-channel-type transistor TR14.

That is, in the amplifier circuit illustrated in FIG. 1, the transistors TR11, TR12 as a differential input circuit that receives a pair of differential inputs are connected between the current source IS11 connected to the power supply line to which the first electric potential is supplied and the folded nodes. Further, the current sources IS12, IS13 are connected between the folded nodes and the power supply lines to which the second electric potential is supplied. Further, the resistors R11, R12 and the inductors L11, L12 as a load circuit are connected between the power supply line to which the first electric potential is supplied and the output nodes from which a pair of differential outputs is output, and the inductors L13, L14 and the transistors TR13, TR14 are connected between the folded nodes and the output nodes.

Here, the output currents of the differential pair by the P-channel-type transistors TR11, TR12 are set to exhibit linearity in a range that is half an amplitude range (full amplitude) of a current that can be output. Incidentally, the amplitude range (full amplitude) of the current that can be output is a range where a current 0 is the minimum value and a current $2I_{dc}$ is the maximum value when a direct-current component of the current is set to $I_{dc}$ (>0). In the case where the current of the current source is set to $I_0$, the value of current flowing through the transistor on one side of the differential pair falls within a range $(½)I_0±(½)I_0$ where the current 0 is the minimum value and the current $I_0$ is the maximum value (the first term indicates the direct-current component (DC component) and the second term indicates the alternating-current component (AC component)).

Then, in this embodiment, the amplifier circuit is designed to be driven in a range that is half the amplitude range (full amplitude) of the current that can be output where the output currents from the input differential pair exhibit linearity and is configured as illustrated in FIG. 1, and thereby is driven with a current width of $±(¼)I_0$ where the linearity is exhibited. That is, currents $I_{DM}$, $I_{DP}$ of the input differential pair fall within a range of $(½)I_0±(¼)I_0$. Then, the alternating currents are folded to flow through the resistors R11, R12 being a load resistor. The current of the folded current source is $(¾)I_0$, the value resulting from subtraction of the DC component is folded, and as for the AC component, the value is folded with an inverted symbol while the absolute value is intact, and thus driving is enabled in a range of $(¼)I_0±(¼)I_0$ as output currents $I_{LP}$, $I_{LM}$ of the amplifier circuit, the DC current component of the first term and the AC current component of the second term are equal, and the output in the full amplitude can be performed.

Further, the folded nodes to which the current sources IS12, IS13 are connected each have a large parasitic capacitance and driving at a high frequency is difficult, and thus the band decreases. Thus, in this embodiment, the inductors L13, L14 are inserted between the folded nodes and the output nodes to achieve capacitance separation, to then enable amplification of a high-frequency signal. That is, as illustrated in FIG. 2, parasitic capacitors $C_F$ and $C_C$ are connected to the folded nodes, but the parasitic capacitors $C_F$ and $C_C$ can be separated by inserting the inductors L13, L14 between the folded nodes and the output nodes. Further, voltages of nodes ncn, ncp are determined according to gate biases of the transistors TR13, TR14, but inductance values of the inductors L13, L14 are set so as to configure a parallel resonant circuit by the inductors L13, L14, and the capacitors $C_F$, and thereby nodes nfn, nfp turn resonant nodes to obtain a high impedance, resulting in that the parasitic capacitances can be cancelled. Further, a back electromotive force is generated by the currents flowing through the inductors L13, L14 to obtain an effect of boosting source voltages of the transistors TR13, TR14.

FIG. 3 illustrates an example of a gain characteristic of the amplifier circuit in this embodiment. In FIG. 3, the horizontal axis indicates a frequency and the vertical axis indicates a gain. Further, a gain characteristic L31 expressed by a solid line indicates the gain characteristic of the amplifier circuit in this embodiment, and a gain characteristic L32 expressed by a dotted line indicates a gain characteristic of a conventional amplifier circuit. According to this embodiment, a linear gain characteristic is exhibited up to a frequency higher than before, resulting in that the linearity of the gain characteristic improves without increasing the power supply voltage. For example, in the case where capacitance values C of the parasitic capacitors of the folded nodes are 100 fF to 300 fF and inductance values L of the inductors L13, L14 are 0.2 nH to 0.8 nH due to layout size restrictions or the like, it becomes possible to correspond to a PAM4 signal of 10 GHz to 36 GHz (20 Gbs to 72 Gbs at a data rate) based on a resonance frequency $f=1/(2\pi(LC)^{0.5})$.

As above, according to this embodiment, by inserting the inductors between the folded nodes and the output nodes in the folded cascode amplifier circuit, lower voltage and linearity both can be achieved, thereby making it possible to obtain good reception accuracy in the amplifier circuit in a reception circuit that amplifies a high-frequency signal.

Figure 11:
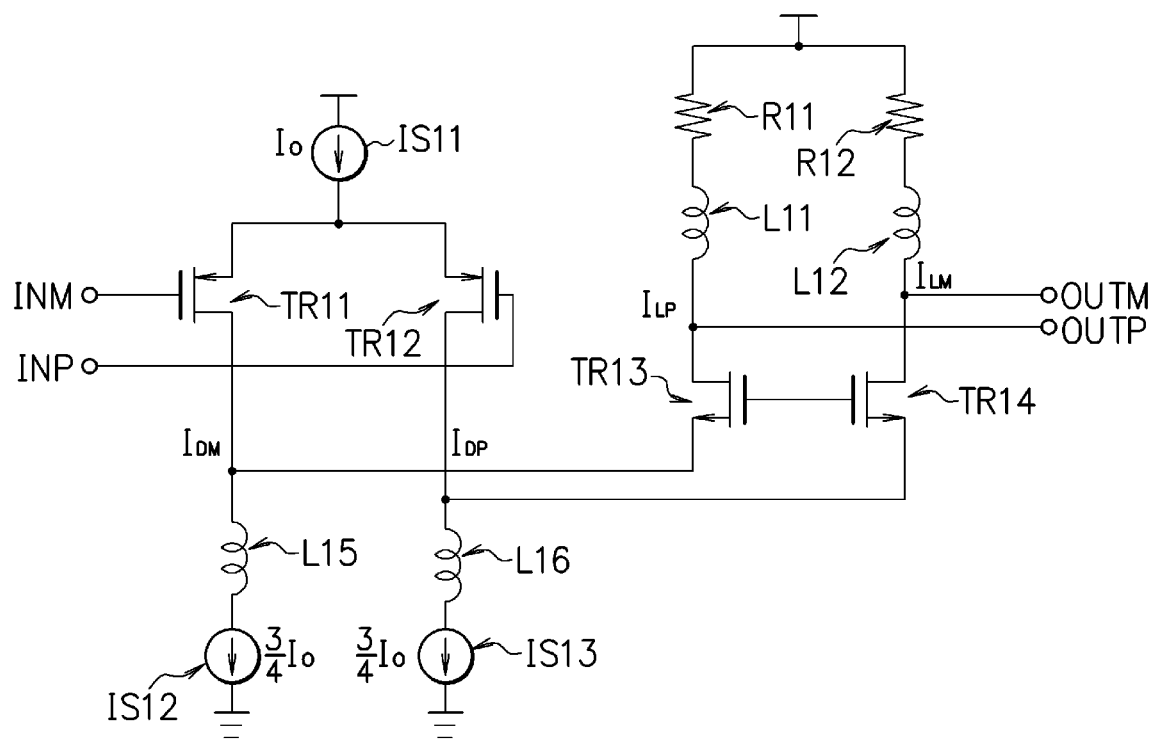
FIG. 11 is a diagram illustrating another configuration example of the amplifier circuit in this embodiment.

Incidentally, in the aforementioned explanation, the inductors L13, L14 are connected between the folded nodes and the output nodes, but as illustrated in FIG. 11, inductors L15, L16 may be connected between the folded nodes and the current sources IS12, IS13. FIG. 11 is a diagram illustrating another configuration example of the amplifier circuit in this embodiment. In FIG. 11, the same reference numerals and symbols are added to the components having the same functions as those of the components illustrated in FIG. 1 and their overlapping explanations are omitted.

In the amplifier circuit illustrated in FIG. 11, the drain of the P-channel-type transistor TR11 is connected to the current source IS12 via the inductor L15 and the drain of the P-channel-type transistor TR12 is connected to the current source IS13 via the inductor L16. Further, the source of the N-channel-type transistor TR13 is connected to a connection point (folded node) between the P-channel-type transistor TR11 and the inductor L15 and the source of the N-channel-type transistor TR14 is connected to a connection point (folded node) between the P-channel-type transistor TR12 and the inductor L16.

That is, in the amplifier circuit illustrated in FIG. 11, the transistors TR11, TR12 as a differential input circuit that receives differential inputs are connected between the current source IS11 connected to the power supply line to which the first electric potential is supplied and the folded nodes. Further, the current sources IS12, IS13 are connected between the folded nodes and the power supply lines to which the second electric potential is supplied. Further, the resistors R11, R12 and the inductors L11, L12 as a load circuit are connected between the power supply line to which the first electric potential is supplied and the folded nodes and the inductors L15, L16 are connected between the folded nodes and the current sources IS12, IS13.

Also in the amplifier circuit configured as illustrated in FIG. 11, inductance values of the inductors L15, L16 are set appropriately, thereby making it possible to configure a parallel resonant circuit by the inductors L15, L16 and the parasitic capacitors of the folded nodes, resulting in that the same effect as that of the amplifier circuit illustrated in FIG. 1 can be obtained.

Figure 4:
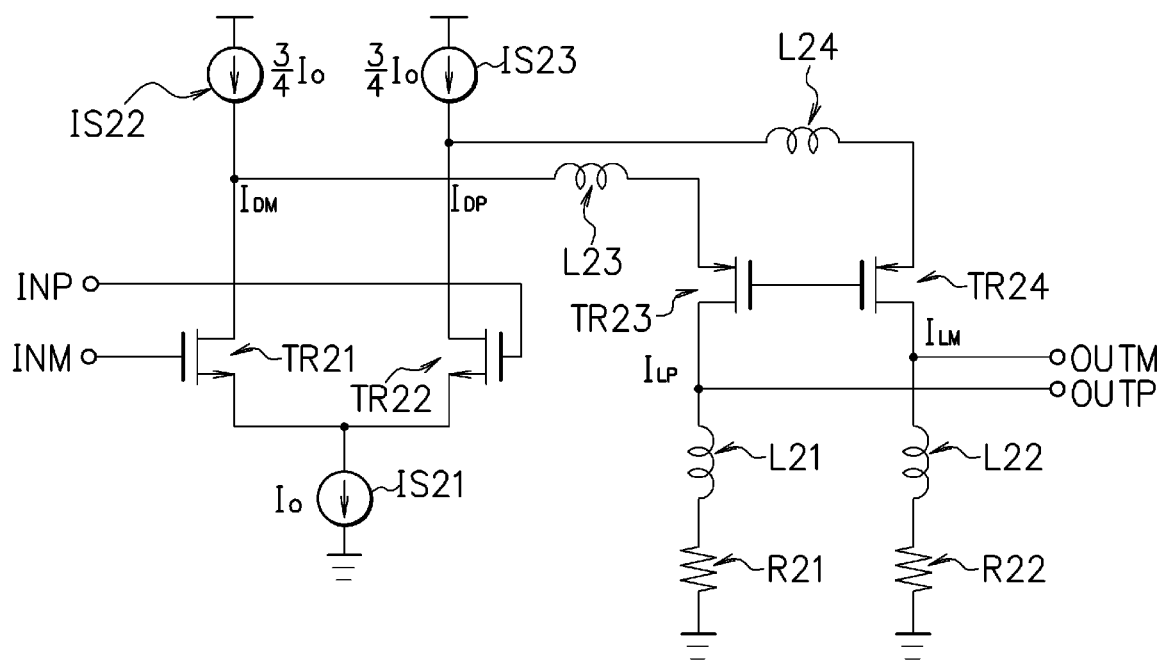
FIG. 4 is a diagram illustrating another configuration example of the amplifier circuit in this embodiment.

Further, in the aforementioned explanation, the amplifier circuit that uses the P-channel-type transistors for the transistors that receive the differential inputs has been described as one example, but as illustrated in FIG. 4, a configuration in which the N-channel-type transistors are used for the transistors that receive the differential inputs is possible and the same effect can be obtained. FIG. 4 is a diagram illustrating another configuration example of the amplifier circuit in this embodiment.

An amplifier circuit illustrated in FIG. 4 includes N-channel-type transistors TR21, TR22, P-channel-type transistors TR23, TR24, current sources IS21, IS22, and IS23, resistors R21, R22, and inductors L21, L22, L23, and L24.

The N-channel-type transistor TR21 has a source thereof connected to the current source IS21, has a gate thereof connected to an input terminal to which one signal INM of differential input signals is input, and has a drain thereof connected to the current source IS22. Further, the N-channel-type transistor TR22 has a source thereof connected to the current source IS21, has a gate thereof connected to an input terminal to which the other signal INP of the differential input signals is input, and has a drain thereof connected to the current source IS23.

The current source IS21 is a current source with a current amount $I_0$ and is connected to a power supply line to which a first electric potential (a low-electric potential VSS in a power supply voltage) is supplied. Further, the current sources IS22, IS23 each are a current source with a current amount $(\sfrac{3}{4})I_0$ and each are connected to a power supply line to which a second electric potential (a high-electric potential VDD in the power supply voltage) is supplied. The current sources IS21, IS22, and IS23 each are fabricated by an MOS transistor, for example.

The resistor R21 is a load resistor, and has one end thereof connected to a power supply line to which the first electric potential (low-electric potential VSS in the power supply voltage) is supplied and has the other end thereof connected to a drain of the P-channel-type transistor TR23 via the inductor L21. Further, the resistor R22 is a load resistor, and has one end thereof connected to a power supply line to which the first electric potential (low-electric potential VSS in the power supply voltage) is supplied and has the other end thereof connected to a drain of the P-channel-type transistor TR24 via the inductor L22.

A connection point (output node) between the inductor L21 and the drain of the P-channel-type transistor TR23 is connected to an output terminal from which one signal OUTP of differential output signals is output. Further, a connection point (output node) between the inductor L22 and the drain of the P-channel-type transistor TR24 is connected to an output terminal from which the other signal OUTM of the differential output signals is output. Incidentally, a bias voltage, which is ground in terms of AC (alternating current) but has a predetermined value in terms of DC (direct current), is applied to gates of the P-channel-type transistors TR23, TR24.

The inductor L23 has one end thereof connected to a connection point (folded node) between the N-channel-type transistor TR21 and the current source IS22 and has the other end thereof connected to a source of the P-channel-type transistor TR23. Further, the inductor L24 has one end thereof connected to a connection point (folded node) between the N-channel-type transistor TR22 and the current source IS23 and has the other end thereof connected to a source of the P-channel-type transistor TR24.

That is, in the amplifier circuit illustrated in FIG. 4, the transistors TR21, TR22 as a differential input circuit that receives a pair of differential inputs are connected between the current source IS21 connected to the power supply line to which the first electric potential is supplied and the folded nodes. Further, the current sources IS22, IS23 are connected between the folded nodes and the power supply lines to which the second electric potential is supplied. Further, the resistors R21, R22 and the inductors L21, L22 as a load circuit are connected between the power supply lines to which the first electric potential is supplied and the output nodes from which a pair of the differential outputs is output, and the inductors L23, L24 and the transistors TR23, TR24 are connected between the folded nodes and the output nodes.

Further, in the amplifier circuit illustrated in FIG. 4, the inductors L23, L24 are connected between the folded nodes and the output nodes, but as illustrated in FIG. 12, inductors L25, L26 may be connected between the folded nodes and the current sources IS22, IS23. FIG. 12 is a diagram illustrating another configuration example of the amplifier circuit in this embodiment. In FIG. 12, the same reference numerals and symbols are added to the components having the same functions as those of the components illustrated in FIG. 4 and their overlapping explanations are omitted.

In the amplifier circuit illustrated in FIG. 12, the drain of the N-channel-type transistor TR21 is connected to the current source IS22 via the inductor L25 and the drain of the N-channel-type transistor TR22 is connected to the current source IS23 via the inductor L26. Further, the source of the P-channel-type transistor TR23 is connected to a connection point (folded node) between the N-channel-type transistor TR21 and the inductor L25 and the source of the P-channel-type transistor TR24 is connected to a connection point (folded node) between the N-channel-type transistor TR22 and the inductor L26.

That is, in the amplifier circuit illustrated in FIG. 12, the transistors TR21, TR22 as a differential input circuit that receives differential inputs are connected between the current source IS21 connected to the power supply line to which the first electric potential is supplied and the folded nodes. Further, the current sources IS22, IS23 are connected between the folded nodes and the power supply lines to which the second electric potential is supplied. Further, the resistors R21, R22 and the inductors L21, L22 as a load circuit are connected between the power supply lines to which the first electric potential is supplied and the folded nodes and the inductors L25, L26 are connected between the folded nodes and the current sources IS22, IS23.

Also in the amplifier circuit configured as illustrated in FIG. 12, inductance values of the inductors L25, L26 are set appropriately, thereby making it possible to configure a parallel resonant circuit by the inductors L25, L26 and the parasitic capacitors of the folded nodes, resulting in that the same effect as that of the amplifier circuit illustrated in FIG. 4 can be obtained.

Next, an adder circuit in one embodiment is explained. FIG. 5 is a diagram illustrating a configuration example of an adder circuit in this embodiment. The adder circuit in this embodiment is an adder circuit using the folded cascode amplifier circuit. The adder circuit in this embodiment is used for a DFE (Decision Feedback Equalizer) of a reception circuit, for example, and adds a feedback signal to an input signal and outputs the resultant.

The adder circuit in this embodiment includes P-channel-type transistors TR31, TR32, N-channel-type transistors TR33, TR34, current sources IS31, IS32, IS33, IS34, and IS35, resistors R31, R32, and inductors L31, L32, L33, and L34.

The P-channel-type transistor TR31 has a source thereof connected to the current source IS31, has a gate thereof connected to an input terminal to which one signal INM of differential input signals is input, and has a drain thereof connected to the current source IS32. Further, the P-channel-type transistor TR32 has a source thereof connected to the current source IS31, has a gate thereof connected to an input terminal to which the other signal INP of the differential input signals is input, and has a drain thereof connected to the current source IS33.

The current source IS31 is a current source with a current amount $I_0$ and is connected to a power supply line to which a first electric potential (a high-electric potential VDD in a power supply voltage) is supplied. Further, the current sources IS32, IS33 each are a current source with a current amount $I_h$ and each are connected to a power supply line to which a second electric potential (a low-electric potential VSS in the power supply voltage) is supplied. The current sources IS31, IS32, and IS33 each are fabricated by an MOS transistor, for example.

The resistor R31 is a load resistor, and has one end thereof connected to a power supply line to which the first electric potential (high-electric potential VDD in the power supply voltage) is supplied and has the other end thereof connected to a drain of the N-channel-type transistor TR33 via the inductor L31. Further, the resistor R32 is a load resistor, and has one end thereof connected to the power supply line to which the first electric potential (high-electric potential VDD in the power supply voltage) is supplied and has the other end thereof connected to a drain of the N-channel-type transistor TR34 via the inductor L32.

A connection point (output node) between the inductor L31 and the drain of the N-channel-type transistor TR33 is connected to an output terminal from which one signal OUTP of differential output signals is output. Further, a connection point (output node) between the inductor L32 and the drain of the N-channel-type transistor TR34 is connected to an output terminal from which the other signal OUTM of the differential output signals is output. Incidentally, a bias voltage, which is ground in terms of AC (alternating current) but has a predetermined value in terms of DC (direct current), is applied to gates of the N-channel-type transistors TR33, TR34.

The inductor L33 has one end thereof connected to a connection point (folded node) between the P-channel-type transistor TR31 and the current source IS32 and has the other end thereof connected to a source of the N-channel-type transistor TR33. Further, the inductor L34 has one end thereof connected to a connection point (folded node) between the P-channel-type transistor TR32 and the current source IS33 and has the other end thereof connected to a source of the N-channel-type transistor TR34.

The current source IS34 is a current source with a current amount $I_{FBP}$ and is connected between the connection point (folded node) between the P-channel-type transistor TR31 and the current source IS32 and a power supply line to which the second electric potential (low-electric potential VSS in the power supply voltage) is supplied. Further, the current source IS35 is a current source with a current amount $I_{FBM}$ and is connected between the connection point (folded node) between the P-channel-type transistor TR32 and the current source IS33 and a power supply line to which the second electric potential (low-electric potential VSS in the power supply voltage) is supplied. Incidentally, the current amount $I_{FBP}$ of the current source IS34 and the current amount $I_{FBM}$ of the current source IS35 are variable and are controlled by not-illustrated control inputs according to an input data decision result of the DFE.

That is, in the adder circuit illustrated in FIG. 5, the transistors TR31, TR32 as a differential input circuit that receives a pair of differential inputs are connected between the current source IS31 connected to the power supply line to which the first electric potential is supplied and the folded nodes. Further, the current sources IS32, IS33 are connected between the folded nodes and the power supply lines to which the second electric potential is supplied. Further, the resistors R31, R32 and the inductors L31, L32 as a load circuit are connected between the power supply lines to which the first electric potential is supplied and the output nodes from which a pair of the differential outputs is output and the inductors L33, L34 and the transistors TR33, TR34 are connected between the folded nodes and the output nodes. Further, the current sources IS34, IS35 whose current amounts are controlled by the control inputs (feedback signals) are connected between the folded nodes and the power supply lines to which the second electric potential is supplied.

In a general adder circuit using a differential pair, even if the current according to the feedback signal is 0, a constant current flows through a load resistor, so that the output currents from the differential pair are limited to a part of the range of the current that can be output. In contrast to this, in the adder circuit in this embodiment, using the folded cascode amplifier circuit enables the output currents from the differential pair to be output over the entire range of the current that can be output without limiting the current according to the feedback signal.

The ranges of values of the respective currents in the adder circuit illustrated in FIG. 5 are described below.

$$I_h = (3/4)I_0 - (1/2)I_{FB0}$$

$$I_{DP}, I_{DM} = (1/2)I_0 \pm (1/4)I_{AC}$$

$$I_{FBP}, I_{FBM} = (1/2)I_{FB0} \pm (1/2)I_{FB}$$

The DC component of a folded current is $I_h + I_{FBP/FBM} = (3/4)I_0$ $$I_{LP}, I_{LM} = (1/4)I_0 \pm (1/4)I_{AC} \pm (1/2)I_{FB}$$

Incidentally, $I_{FB0}$ is a direct-current component (DC component) of the current in the current sources IS34, IS35, $I_{AC}$ is an alternating-current component (AC component) of the output current, and $I_{FB}$ is an alternating-current component (AC component), of the current in the current sources IS34, IS35, to be controlled according to the control inputs.

As above, the current source of the differential pair is $I_0$, the folded direct current is $(3/2) I_0$ in total of differentials, and the direct current of $(1/2) I_0$ flows through the load resistor. The above equations each are an equation representing the current flowing through a half circuit, and the first term indicates the DC current. Accordingly, when the feedback signal is 0, the direct current related to the feedback does not flow through the load, and thus the output in the entire range of the current that can be output in the differential pair is enabled. Further, similarly to the aforementioned amplifier circuit, the inductors L33 and L34 are inserted between the folded nodes and the output nodes, and thereby, it is possible to correspond to high-frequency signals.

Incidentally, in the adder circuit illustrated in FIG. 5, the inductors L33, L34 are connected between the folded nodes and the output nodes, but as illustrated in FIG. 13, inductors L35 and L36 may be connected between the folded nodes and the current sources IS32, IS33. FIG. 13 is a diagram illustrating another configuration example of the adder circuit in this embodiment. In FIG. 13, the same reference numerals and symbols are added to the components having the same functions as those of the components illustrated in FIG. 5 and their overlapping explanations are omitted.

In the adder circuit illustrated in FIG. 13, the drain of the P-channel-type transistor TR31 is connected to the current source IS32 via the inductor L35, and the drain of the P-channel-type transistor TR32 is connected to the current source IS33 via the inductor L36. The source of the N-channel-type transistor TR33 is connected to a connection point (folded node) between the P-channel-type transistor TR31 and the inductor L35, and the source of the N-channel-type transistor TR34 is connected to a connection point (folded node) between the P-channel-type transistor TR32 and the inductor L36. Further, the current source IS34 is connected between the connection point (folded node) between the P-channel-type transistor TR31 and the inductor L35 and the power supply line to which the second electric potential is supplied. The current source IS35 is connected between the connection point (folded node) between the P-channel-type transistor TR32 and the inductor L36 and the power supply line to which the second electric potential is supplied.

That is, in the adder circuit illustrated in FIG. 13, the transistors TR31, TR32 as a differential input circuit that receives differential inputs are connected between the current source IS31 connected to the power supply line to which the first electric potential is supplied and the folded nodes. Further, the current sources IS32, IS33 are connected between the folded nodes and the power supply lines to which the second electric potential is supplied. Further, the resistors R31, R32 and the inductors L31, L32 as a load circuit are connected between the power supply line to which the first electric potential is supplied and the folded nodes and the inductors L35, L36 are connected between the folded nodes and the current sources IS32, IS33. Further, the current sources IS34, IS35 whose current amounts are controlled by the control inputs (feedback signals) are connected between the folded nodes and the power supply lines to which the second electric potential is supplied.

Also in the adder circuit configured as illustrated in FIG. 13, it is possible to configure a parallel resonant circuit by the inductors L35, L36 and the parasitic capacitors of the folded nodes, resulting in that the same effect as that of the adder circuit illustrated in FIG. 5 can be obtained.

FIG. 6 is a diagram illustrating another configuration example of the adder circuit in this embodiment. The adder circuit illustrated in FIG. 6 is that current sources IS36, IS37, IS38, and IS39 are provided in place of the current sources IS34, IS35 that apply the current according to the control inputs (feedback signals). In FIG. 6, the same reference numerals and symbols are added to the components having the same functions as those of the components illustrated in FIG. 5 and their overlapping explanations are omitted.

The current source IS36 is a current source with a current amount $I_{FBM}$ and is connected between the connection point (folded node) between the P-channel-type transistor TR31 and the current source IS32 and a power supply line to which the first electric potential (high-electric potential VDD in the power supply voltage) is supplied, and the current source IS37 is a current source with a current amount $(1/2)I_{FB0}$ and is connected between the connection point (folded node) between the P-channel-type transistor TR31 and the current source IS32 and a power supply line to which the second electric potential (low-electric potential VSS in the power supply voltage) is supplied. Further, the current source IS38 is a current source with a current amount $I_{FBP}$ and is connected between the connection point (folded node) between the P-channel-type transistor TR32 and the current source IS33 and a power supply line to which the first electric potential (high-electric potential VDD in the power supply voltage) is supplied, and the current source IS39 is a current source with a current amount $(1/2)I_{FB0}$ and is connected between the connection point (folded node) between the P-channel-type transistor TR32 and the current source IS33 and a power supply line to which the second electric potential (low-electric potential VSS in the power supply voltage) is supplied. Incidentally, the current amount $I_{FBM}$ of the current source IS36 and the current amount $I_{FBP}$ of the current source IS38 are variable and are controlled by not-illustrated control inputs according to an input data decision result of the DFE. Further, in the configuration illustrated in FIG. 6, the current $I_h$ is $(3/4)I_0$.

In the adder circuit illustrated in FIG. 6, the current sources IS36, IS38 apply a current containing a direct-current component and an alternating-current component and the current sources IS37, IS39 apply a current of the direct-current component, so that only the current of the alternating-current component is folded. The current flowing through the load resistors R31, R32 is the same as that in the aforementioned adder circuit illustrated in FIG. 5, and the same effect is obtained.

Figure 14:
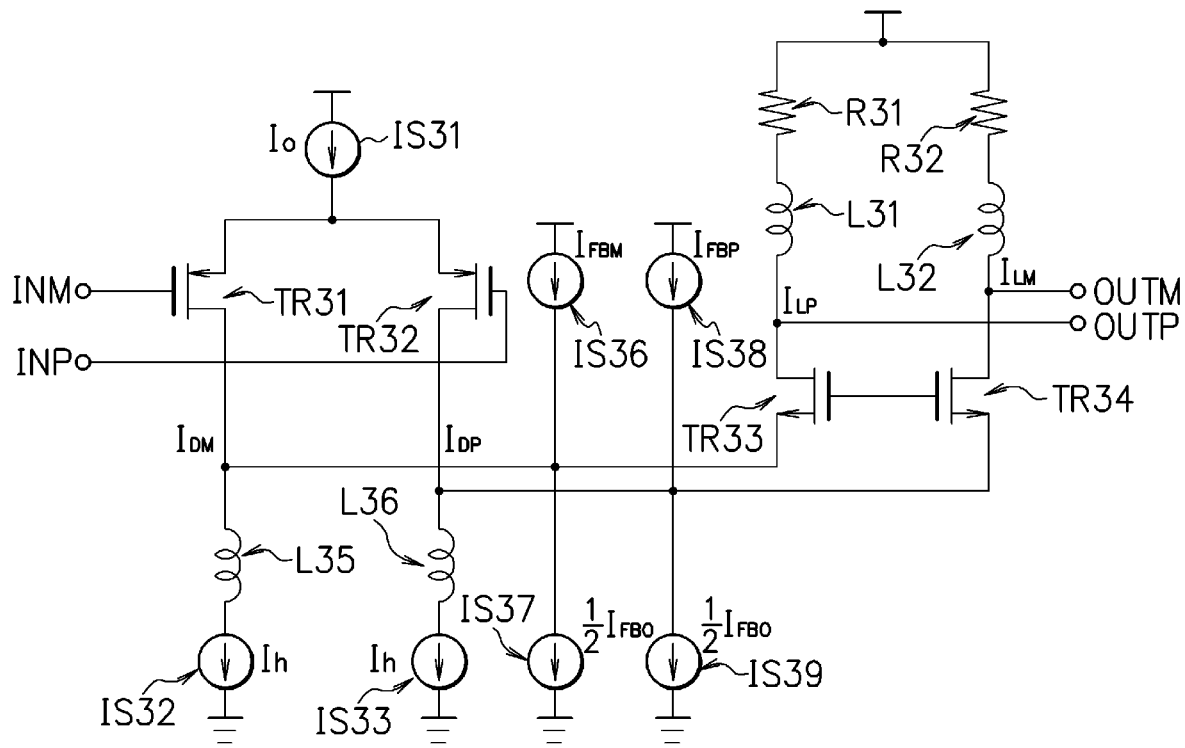
FIG. 14 is a diagram illustrating another configuration example of the adder circuit in this embodiment.

Incidentally, in the adder circuit illustrated in FIG. 6, the inductors L33, L34 are connected between the folded nodes and the output nodes, but as illustrated in FIG. 14, the inductors L35, L36 may be connected between the folded nodes and the current sources IS32, IS33. FIG. 14 is a diagram illustrating another configuration example of the adder circuit in this embodiment. In FIG. 14, the same reference numerals and symbols are added to the components having the same functions as those of the components illustrated in FIG. 6 and FIG. 13 and their overlapping explanations are omitted.

In the adder circuit illustrated in FIG. 14, the current source IS36 is connected between the connection point (folded node) between the P-channel-type transistor TR31 and the inductor L35 and the power supply line to which the first electric potential is supplied, and the current source IS37 is connected between the connection point (folded node) between the P-channel-type transistor TR31 and the inductor L35 and the power supply line to which the second electric potential is supplied. Further, the current source IS38 is connected between the connection point (folded node) between the P-channel-type transistor TR32 and the inductor L36 and the power supply line to which the first electric potential is supplied, and the current source IS39 is connected between the connection point (folded node) between the P-channel-type transistor TR32 and the inductor L36 and the power supply line to which the second electric potential is supplied. Also in the adder circuit configured as illustrated in FIG. 14, it is possible to configure a parallel resonant circuit by the inductors L35, L36 and the parasitic capacitors of the folded nodes, resulting in that the same effect as that of the adder circuit illustrated in FIG. 6 can be obtained.

Figure 7:
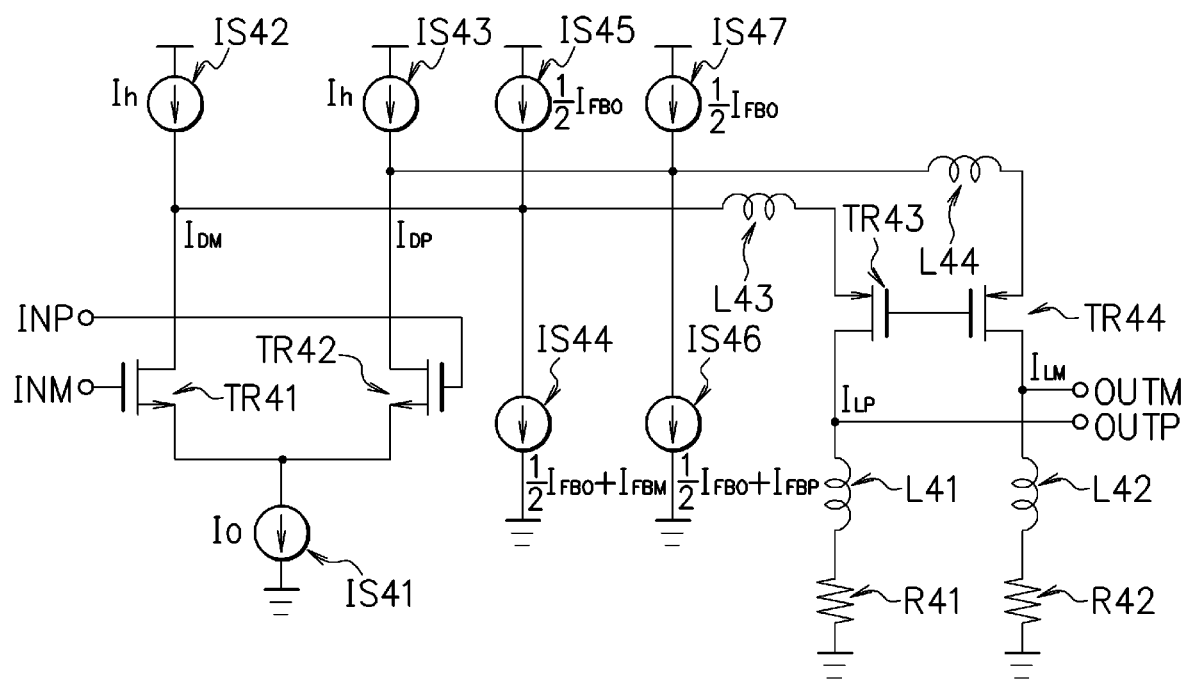
FIG. 7 is a diagram illustrating another configuration example of the adder circuit in this embodiment.

Further, in the aforementioned explanation, the adder circuit using the differential pair of the P-channel-type transistors has been explained as an example, but as illustrated in FIG. 7, a configuration using a differential pair of N-channel-type transistors is also possible and the same effect can be obtained. FIG. 7 is a diagram illustrating another configuration example of the adder circuit in this embodiment.

The adder circuit in this embodiment includes N-channel-type transistors TR41, TR42, P-channel-type transistors TR43, TR44, current sources IS41, IS42, IS43, IS44, IS45, IS46, and IS47, resistors R41, R42, and inductors L41, L42, L43, and L44.

The N-channel-type transistor TR41 has a source thereof connected to the current source IS41, has a gate thereof connected to an input terminal to which one signal INM of differential input signals is input, and has a drain thereof connected to the current source IS42. Further, the N-channel-type transistor TR42 has a source thereof connected to the current source IS41, has a gate thereof connected to an input terminal to which the other signal INP of the differential input signals is input, and has a drain thereof connected to the current source IS43.

The current source IS41 is a current source with a current amount $I_0$ and is connected to a power supply line to which the first electric potential (low-electric potential VSS in the power supply voltage) is supplied. Further, the current sources IS42, IS43 each are a current source with a current amount $I_h$ and each are connected to a power supply line to which the second electric potential (high-electric potential VDD in the power supply voltage) is supplied. The current sources IS41, IS42, and IS43 each are fabricated by an MOS transistor, for example.

The resistor R41 is a load resistor, and has one end thereof connected to a power supply line to which the first electric potential (low-electric potential VSS in the power supply voltage) is supplied and has the other end thereof connected to a drain of the P-channel-type transistor TR43 via the inductor L41. Further, the resistor R42 is a load resistor, and has one end thereof connected to a power supply line to which the first electric potential (low-electric potential VSS in the power supply voltage) is supplied and has the other end thereof connected to a drain of the P-channel-type transistor TR44 via the inductor L42.

A connection point (output node) between the inductor L41 and the drain of the P-channel-type transistor TR43 is connected to an output terminal from which one signal OUTP of differential output signals is output. Further, a connection point (output node) between the inductor L42 and the drain of the P-channel-type transistor TR44 is connected to an output terminal from which the other signal OUTM of the differential output signals is output. Incidentally, a bias voltage, which is ground in terms of AC (alternating current) but has a predetermined value in terms of DC (direct current), is applied to gates of the P-channel-type transistors TR43, TR44.

The inductor L43 has one end thereof connected to a connection point (folded node) between the N-channel-type transistor TR41 and the current source IS42 and has the other end thereof connected to a source of the P-channel-type transistor TR43. Further, the inductor L44 has one end thereof connected to a connection point (folded node) between the N-channel-type transistor TR42 and the current source IS43 and has the other end thereof connected to a source of the P-channel-type transistor TR44.

The current source IS44 is a current source with a current amount $(½)I_{FB0}+I_{FBM}$ and is connected between the connection point (folded node) between the N-channel-type transistor TR41 and the current source IS42 and a power supply line to which the first electric potential (low-electric potential VSS in the power supply voltage) is supplied, and the current source IS45 is a current source with a current amount $(½)I_{FB0}$ and is connected between the connection point (folded node) between the N-channel-type transistor TR41 and the current source IS42 and a power supply line to which the second electric potential (high-electric potential VDD in the power supply voltage) is supplied. Further, the current source IS46 is a current source with a current amount $(½)I_{FB0}+I_{FBP}$ and is connected between the connection point (folded node) between the N-channel-type transistor TR42 and the current source IS43 and a power supply line to which the first electric potential (low-electric potential VSS in the power supply voltage) is supplied, and the current source IS47 is a current source with a current amount $(½)I_{FB0}$ and is connected between the connection point (folded node) between the N-channel-type transistor TR42 and the current source IS43 and a power supply line to which the second electric potential (high-electric potential VDD in the power supply voltage) is supplied. Incidentally, the current amount $I_{FBM}$ of the current source IS44 and the current amount $I_{FBP}$ of the current source IS46 are variable and are controlled by not-illustrated control inputs.

Figure 15:
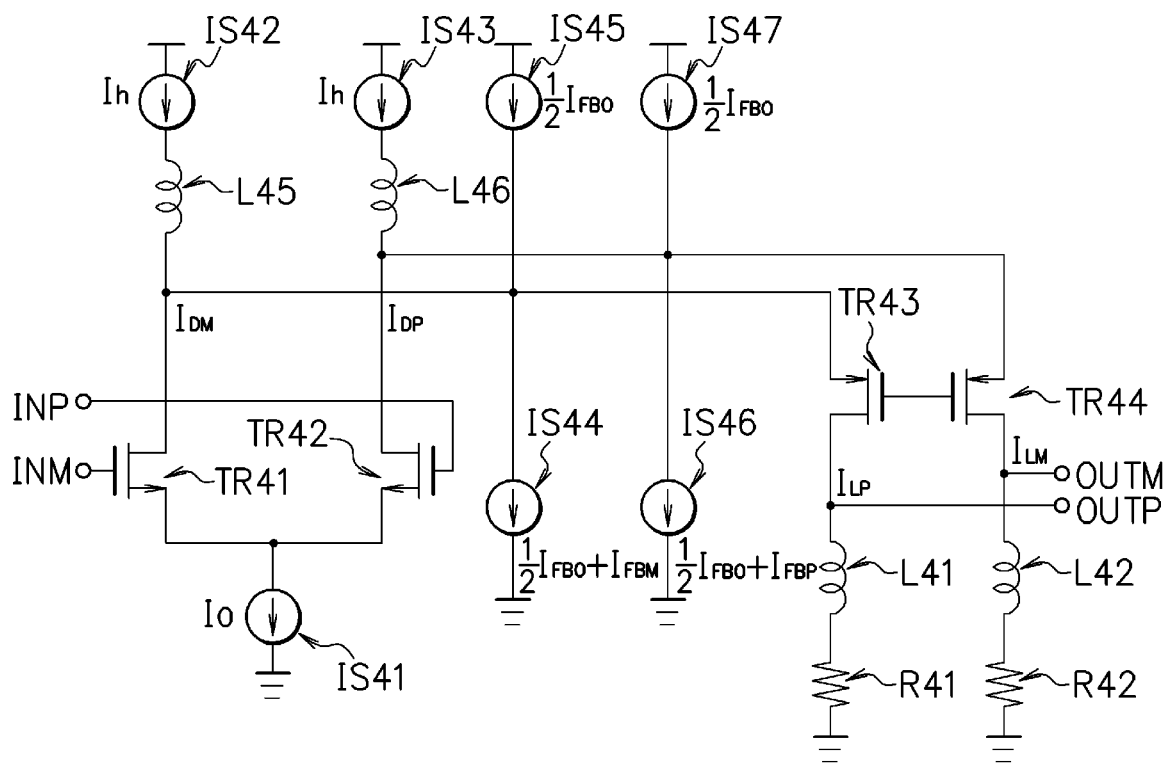
FIG. 15 is a diagram illustrating another configuration example of the adder circuit in this embodiment.

Incidentally, in the adder circuit illustrated in FIG. 7, the inductors L43, L44 are connected between the folded nodes and the output nodes, but as illustrated in FIG. 15, inductors L45, L46 may be connected between the folded nodes and the current sources IS42, IS43. FIG. 15 is a diagram illustrating another configuration example of the adder circuit in this embodiment. In FIG. 15, the same reference numerals and symbols are added to the components having the same functions as those of the components illustrated in FIG. 7 and their overlapping explanations are omitted.

In the adder circuit illustrated in FIG. 15, the drain of the N-channel-type transistor TR41 is connected to the current source IS42 via the inductor L45, and the drain of the N-channel-type transistor TR42 is connected to the current source IS43 via the inductor L46. The source of the P-channel-type transistor TR43 is connected to a connection point (folded node) between the N-channel-type transistor TR41 and the inductor L45, and the source of the P-channel-type transistor TR44 is connected to a connection point (folded node) between the N-channel-type transistor TR42 and the inductor L46.

The current source IS44 is connected between the connection point (folded node) between the N-channel-type transistor TR41 and the inductor L45 and the power supply line to which the first electric potential is supplied, and the current source IS45 is connected between the connection point (folded node) between the N-channel-type transistor TR41 and the inductor L45 and the power supply line to which the second electric potential is supplied. Further, the current source IS46 is connected between the connection point (folded node) between the N-channel-type transistor TR42 and the inductor L46 and the power supply line to which the first electric potential is supplied, and the current source IS47 is connected between the connection point (folded node) between the N-channel-type transistor TR42 and the inductor L46 and the power supply line to which the second electric potential is supplied. Also in the adder circuit configured as illustrated in FIG. 15, it is possible to configure a parallel resonant circuit by the inductors L45, L46 and the parasitic capacitors of the folded nodes, resulting in that the same effect as that of the adder circuit illustrated in FIG. 7 can be obtained.

Figure 8:
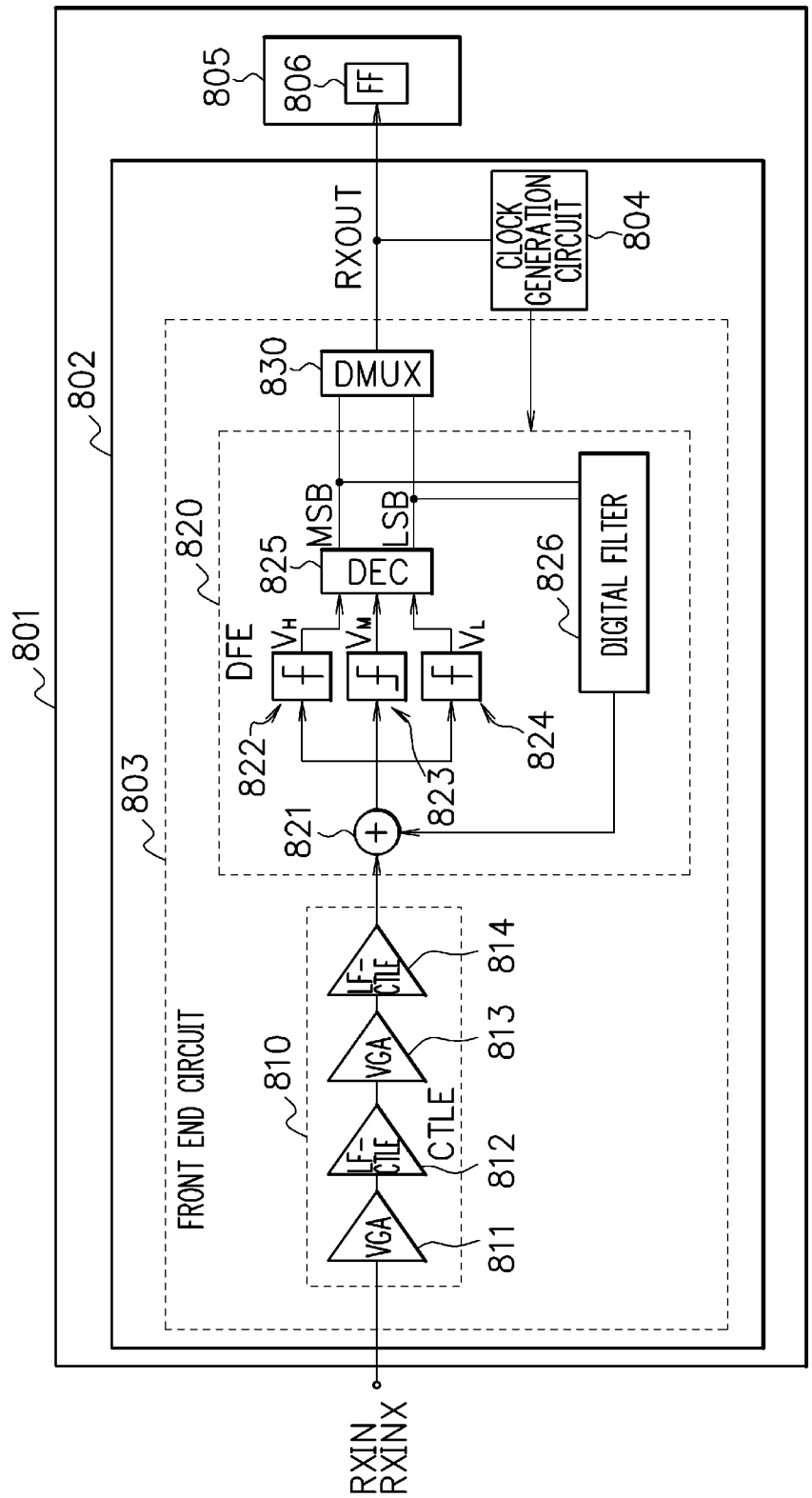
FIG. 8 is a diagram illustrating a configuration example of an integrated circuit in this embodiment.

FIG. 8 is a diagram illustrating a configuration example of an integrated circuit in this embodiment. An integrated circuit 801 in this embodiment includes: a reception circuit 802 having a function of a deserializer circuit that converts an input serial signal of a quaternary PAM4 signal into a parallel signal; and an internal circuit 805 such as a logic circuit that receives a parallel signal (data) from the reception circuit 802 to perform processing. The reception circuit 802 includes a front end circuit 803 and a clock generating circuit 804. The front end circuit 803 includes an equalizer circuit (CTLE: Continuous Time Linear Equalizer) 810, a decision circuit (DFE) 820, and a demultiplexer 830.

The equalizer circuit 810 is configured by using the aforementioned amplifier circuit in this embodiment, and includes a variable gain amplifier (VGA) 811, a high-frequency equalizer (HF-CTLE) 812, a variable gain amplifier (VGA) 813, and a low-frequency equalizer (LF-CTLE) 814. The variable gain amplifier (VGA) 811 amplifies differential input serial signals (PAM4 signals) RXIN, RXINX transmitted through a transmission path or the like. The high-frequency equalizer (HF-CTLE) 812 is a circuit that compensates for and recovers a high-frequency component attenuated by the transmission path, and compensates for a high-frequency component of the PAM4 signals amplified by the variable gain amplifier (VGA) 811. The variable gain amplifier (VGA) 813 amplifies the PAM4 signals with the high-frequency component compensated by the high-frequency equalizer (HF-CTLE) 812. The low-frequency equalizer (LF-CTLE) 814 is a circuit that compensates for and recovers a high-frequency component attenuated by the transmission path, and attenuates a low-frequency component of the PAM4 signals amplified by the variable gain amplifier (VGA) 813.

The decision circuit 820 includes an adder circuit 821, comparator circuits 822, 823, and 824, a decoder 825, and a digital filter 826. The adder circuit 821 is configured by using the aforementioned adder circuit in this embodiment, and adds a signal according to a control input (feedback signal) output from the digital filter 826 to the PAM4 signals output from the equalizer circuit 810 to output the resultant. The comparator circuits 822, 823, and 824 each are a comparator circuit for deciding values of the PAM4 signals obtained after the addition processing, the PAM4 signals output from the adder circuit 821. The comparator circuits 822, 823, and 824 have threshold values different from one another, and for example, the comparator circuit 822 has decision threshold values of a value "11b" and a value "10b," the comparator circuit 823 has decision threshold values of a value "10b" and a value "01b," and the comparator circuit 824 has decision threshold values of a value "01b" and a value "00b."

The decoder 825 decodes outputs from the comparator circuits 822 to 824 and decides values of the PAM4 signals (MSB and LSB) to output the values. The digital filter 826 subjects the values (MSB and LSB) of the PAM4 signals output from the decoder 825 to filtering and generates a feedback signal to output it to the adder circuit 821. The demultiplexer 830 converts the outputs from the decision circuit 820 into a parallel signal RXOUT to output it.

The clock generating circuit 804 refers to the output or the like from the front end circuit 803 to generate a clock signal and supplies it to the decision circuit 820 and the like. The parallel signal RXOUT output from the reception circuit 802 is taken into the internal circuit 805 by a flip-flop 806 to be subjected to processing, and the like.

Figure 9A:
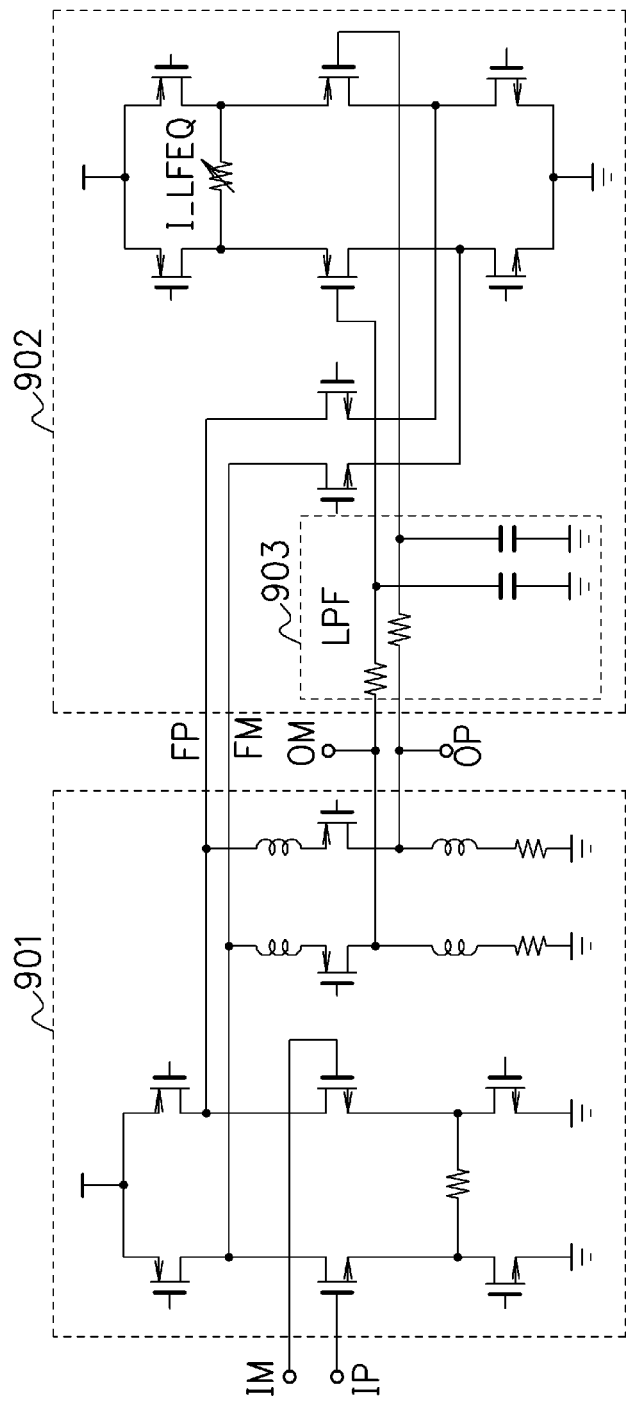
FIG. 9A is a diagram illustrating a configuration example of a low-frequency equalizer in this embodiment.
Figure 9B:
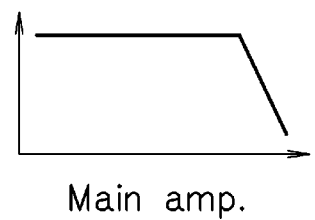
FIG. 9B is a view explaining a characteristic of the low-frequency equalizer illustrated in FIG. 9A.

FIG. 9A is a diagram illustrating a configuration example of the low-frequency equalizer illustrated in FIG. 8. As illustrated in FIG. 9A, the low-frequency equalizer includes a folded cascode amplifier circuit 901 and a feedback amplifier circuit 902 including a low-pass filter 903. The folded cascode amplifier circuit 901 is configured in the same manner as the aforementioned amplifier circuit in this embodiment, and exhibits such a gain characteristic as illustrated in FIG. 9B in the case of no inputs of output signals FP, FM from the feedback amplifier circuit 902. The folded cascode amplifier circuit 901 receives differential input signals IP, IM to output differential output signals OP, OM. Further, to the folded cascode amplifier circuit 901, the output signals FP, FM from the feedback amplifier circuit 902 are input.

Figure 9C:
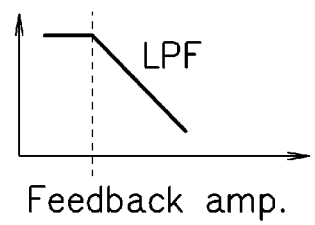
FIG. 9C is a view explaining the characteristic of the low-frequency equalizer illustrated in FIG. 9A.

The feedback amplifier circuit 902 receives the differential output signals OP, OM output from the folded cascode amplifier circuit 901 through the internal low-pass filter 903. The feedback amplifier circuit 902 has such a characteristic as illustrated in FIG. 9C, and generates the output signals FP, FM based on a low-frequency component of the differential output signals OP, OM to output them.

By applying feedback to the folded cascode amplifier circuit 901 with the output signals FP, FM of the feedback amplifier circuit 902 including the low-pass filter 903 as above, the gain of the folded cascode amplifier circuit 901 with respect to the low-frequency component is attenuated.

Figure 9D:
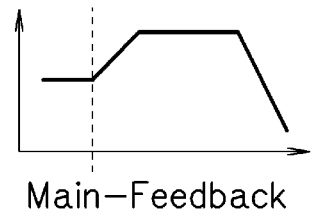
FIG. 9D is a view explaining the characteristic of the low-frequency equalizer illustrated in FIG. 9A.

Thereby, the gain characteristic in the folded cascode amplifier circuit 901 becomes as illustrated in FIG. 9D, and it becomes possible to compensate for the high-frequency component attenuated by the transmission path in a received signal.

Figure 10A:
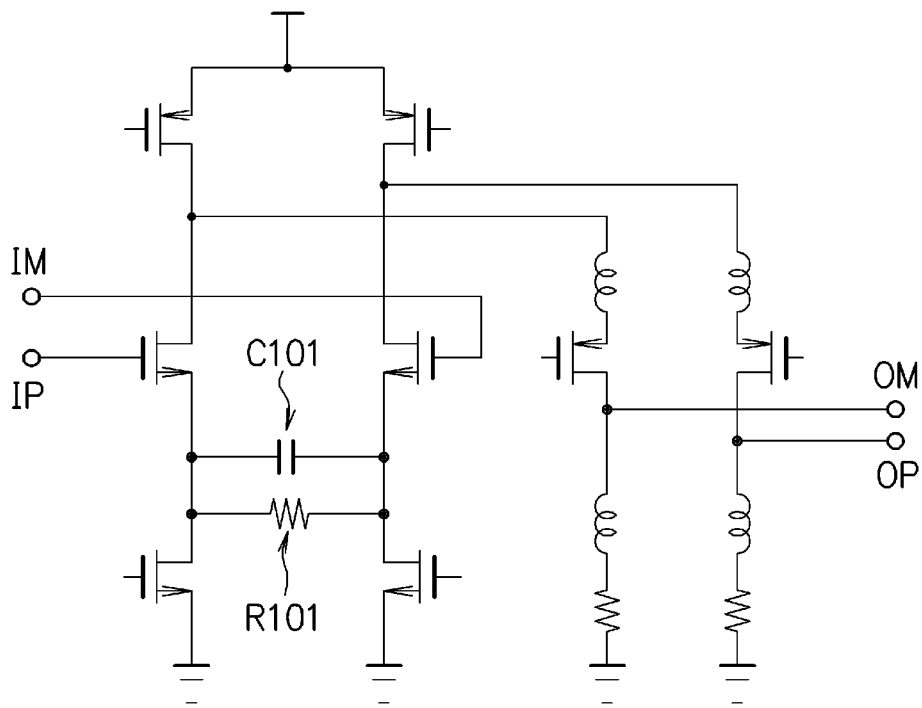
FIG. 10A is a diagram illustrating a configuration example of a high-frequency equalizer in this embodiment.

FIG. 10A is a diagram illustrating a configuration example of the high-frequency equalizer illustrated in FIG. 8. As illustrated in FIG. 10A, the high-frequency equalizer is configured in the same manner as the aforementioned amplifier circuit in this embodiment, and further includes a resistor 8101 and a capacitor C101 between the sources of the transistors of the differential pair. The high-frequency equalizer illustrated in FIG. 10A receives the differential input signals IP, IM to output the differential output signals OP, OM.

Figure 10B:
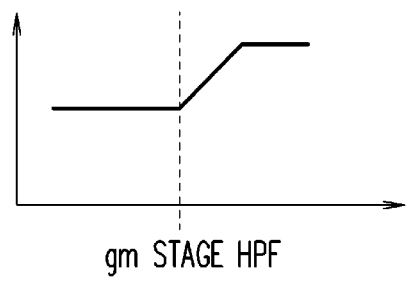
FIG. 10B is a view explaining a characteristic of the high-frequency equalizer illustrated in FIG. 10A.
Figure 10C:
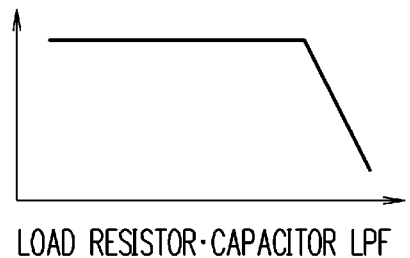
FIG. 10C is a view explaining the characteristic of the high-frequency equalizer illustrated in FIG. 10A.
Figure 10D:
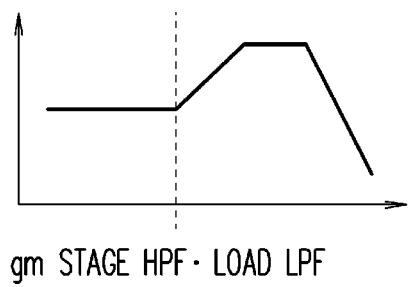
FIG. 10D is a view explaining the characteristic of the high-frequency equalizer illustrated in FIG. 10A.

In the folded cascode amplifier circuit, a mutual conductance (gm) is determined by the resistor R101 between the sources of the transistors of the differential pair (gm=1/R), only with the gm stage, such a gain characteristic as illustrated in FIG. 10B is exhibited normally, and in the case where the load resistor is only seen, such a gain characteristic as illustrated in FIG. 10C is exhibited. In contrast to this, as illustrated in FIG. 10A, the capacitor C101 is connected between the sources of the transistors of the differential pair in parallel with the resistor R101, and thereby at high frequencies, the sources of the transistors of the differential pair are short-circuited to increase the mutual conductance (gm), and as illustrated in FIG. 10D, a characteristic in which the gain at high frequencies increases is exhibited. This makes the high-frequency equalizer illustrated in FIG. 10A possible to compensate for the high-frequency component attenuated by a transmission path in a received signal.

Further, the aforementioned embodiment merely illustrates one concrete example of implementing the present invention, and the technical scope of the present invention is not to be construed in a restrictive manner by the embodiment. That is, the present invention may be implemented in various forms without departing from the technical spirit or main features thereof.

According to the embodiment, it is possible to provide an amplifier circuit and an adder circuit in a reception circuit capable of achieving both lower voltage and linearity.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier circuit, comprising:
a first node, a second node, a third node and a fourth node;
a first current source that is connected to a power supply line to which a first electric potential is supplied;
a differential input circuit that is connected between the first current source and the first and third nodes and configured to receive a differential input signal;
a second current source that is connected between a power supply line to which a second electric potential different from the first electric potential is supplied and the first and third nodes;
a load circuit that is connected between the power supply line to which the first electric potential is supplied and the second and fourth nodes and configured to generate a differential output signal;
a first inductor circuit that is connected between the first node and the second node; and
a second inductor circuit that is connected between the third node and the fourth node.

2. The amplifier circuit according to claim 1, wherein
a parasitic capacitor which is parasitic on the first node and an inductor of the first inductor circuit constitute a first parallel resonant circuit, and
a parasitic capacitor which is parasitic on the third node and an inductor of the second inductor circuit constitute a second parallel resonant circuit.

3. The amplifier circuit according to claim 1, wherein
the differential input circuit includes a P-channel-type transistor that has a gate thereof to which the differential input signal is input, and
the first electric potential is an electric potential higher than the second electric potential.

4. The amplifier circuit according to claim 1, wherein
the differential input circuit includes an N-channel-type transistor that has a gate thereof to which the differential input signal is input, and
the first electric potential is an electric potential lower than the second electric potential.

5. A reception circuit, comprising:
an amplifier circuit according to claim 1, the amplifier circuit being configured to amplify an input differential input signal and output the amplified differential input signal; and
a decision circuit configured to decide a value of the differential input signal amplified by the amplifier circuit.

6. An integrated circuit, comprising:
an amplifier circuit according to claim 1, the amplifier circuit being configured to amplify an input differential input signal and output the amplified differential input signal;
a decision circuit configured to decide a value of the differential input signal amplified by the amplifier circuit; and
an internal circuit configured to receive a signal related to the value decided by the decision circuit and perform processing operation.

7. An amplifier circuit, comprising:
a first current source that is connected to a power supply line to which a first electric potential is supplied;
a differential input circuit that is connected between the first current source and first and second nodes and configured to receive a differential input signal;
a second current source that is connected between a power supply line to which a second electric potential different from the first electric potential is supplied and the first and second nodes;
a load circuit that is connected between the power supply line to which the first electric potential is supplied and the first and second nodes and configured to generate a differential output signal;
a first inductor circuit that is connected between the first node and the second current source; and
a second inductor circuit that is connected between the second node and the second current source.

8. The amplifier circuit according to claim 7, wherein
a parasitic capacitor which is parasitic on the first node and an inductor of the first inductor circuit constitute a first parallel resonant circuit, and
a parasitic capacitor which is parasitic on the second node and an inductor of the second inductor circuit constitute a second parallel resonant circuit.

9. A reception circuit, comprising:
an amplifier circuit according to claim 7, the amplifier circuit being configured to amplify an input differential input signal and output the amplified differential input signal; and
a decision circuit configured to decide a value of the differential input signal amplified by the amplifier circuit.

10. An integrated circuit, comprising:
an amplifier circuit according to claim 7, the amplifier circuit being configured to amplify an input differential input signal and output the amplified differential input signal;
a decision circuit configured to decide a value of the differential input signal amplified by the amplifier circuit; and
an internal circuit configured to receive a signal related to the value decided by the decision circuit and perform processing operation.

11. An adder circuit, comprising:
a first node, a second node, a third node and a fourth node;
a first current source that is connected to a power supply line to which a first electric potential is supplied;
a differential input circuit that is connected between the first current source and the first and third nodes and configured to receive a differential input signal;
a second current source that is connected between a power supply line to which a second electric potential different from the first electric potential is supplied and the first and third nodes;
a load circuit that is connected between the power supply line to which the first electric potential is supplied and the second and fourth nodes and configured to generate a differential output signal;
a first inductor circuit that is connected between the first node and the second node;
a second inductor circuit that is connected between the third node and the fourth node;
a third current source that is connected between the power supply line to which the second electric potential is supplied and the first node, a current amount of the third current source changing according to a control input; and
a fourth current source that is connected between the power supply line to which the second electric potential is supplied and the third node, a current amount of the fourth current source changing according to the control input.

12. The adder circuit according to claim 11, wherein
a parasitic capacitor which is parasitic on the first node and an inductor of the first inductor circuit constitute a first parallel resonant circuit, and
a parasitic capacitor which is parasitic on the third node and an inductor of the second inductor circuit constitute a second parallel resonant circuit.

13. A reception circuit, comprising:
an amplifier circuit configured to amplify an input differential input signal and output the amplified differential input signal; and
a decision circuit that comprises an adder circuit according to claim 11, the adder circuit being configured to add a signal based on a control input according to a value previously decided to the differential input signal amplified by the amplifier circuit, and decide a value of the differential input signal by an output from the adder circuit.

14. An integrated circuit, comprising:
an amplifier circuit configured to amplify an input differential input signal and output the amplified differential input signal;
a decision circuit that comprises an adder circuit according to claim 11, the adder circuit being configured to add a signal based on a control input according to a value previously decided to the differential input signal amplified by the amplifier circuit, and decide a value of the differential input signal by an output from the adder circuit; and
an internal circuit configured to receive a signal related to the value decided by the decision circuit and perform processing operation.

15. An adder circuit, comprising:
a first current source that is connected to a power supply line to which a first electric potential is supplied;
a differential input circuit that is connected between the first current source and a first node and configured to receive a differential input signal;
a second current source that is connected between a power supply line to which a second electric potential different from the first electric potential is supplied and the first node;
a load circuit that is connected between the power supply line to which the first electric potential is supplied and a second node;
an inductor circuit that is connected between the first node and the second node;
a third current source that is connected between the power supply line to which the second electric potential is supplied and the first node; and
a fourth current source that is connected between the power supply line to which the first electric potential is supplied and the first node, a current amount of the fourth current source changing according to a control input.

16. The adder circuit according to claim 15, wherein
a parasitic capacitor which is parasitic on the first node and an inductor of the inductor circuit constitute a parallel resonant circuit.

17. A reception circuit, comprising:
an amplifier circuit configured to amplify an input differential input signal and output the amplified differential input signal; and
a decision circuit that comprises an adder circuit according to claim 15, the adder circuit being configured to add a signal based on a control input according to a value previously decided to the differential input signal amplified by the amplifier circuit, and decide a value of the differential input signal by an output from the adder circuit.

18. An integrated circuit, comprising:
an amplifier circuit configured to amplify an input differential input signal and output the amplified differential input signal;
a decision circuit that comprises an adder circuit according to claim 8, the adder circuit being configured to add a signal based on a control input according to a value previously decided to the differential input signal amplified by the amplifier circuit, and decide a value of the differential input signal by an output from the adder circuit; and an internal circuit configured to receive a signal related to the value decided by the decision circuit and perform processing operation.

19. An adder circuit, comprising:
a first current source that is connected to a power supply line to which a first electric potential is supplied;
a differential input circuit that is connected between the first current source and a first node and configured to receive a differential input signal;
a second current source that is connected between a power supply line to which a second electric potential different from the first electric potential is supplied and the first node;
a load circuit that is connected between the power supply line to which the first electric potential is supplied and the first node;
an inductor circuit that is connected between the first node and the second current source; and
a third current source that is connected between the power supply line to which the second electric potential is supplied and the first node, a current amount of the third current source changing according to a control input.

20. The adder circuit according to claim 19, wherein
a parasitic capacitor which is parasitic on the first node and an inductor of the inductor circuit constitute a parallel resonant circuit.

21. A reception circuit, comprising:
an amplifier circuit configured to amplify an input differential input signal and output the amplified differential input signal; and
a decision circuit that comprises an adder circuit according to claim 9, the adder circuit being configured to add a signal based on a control input according to a value previously decided to the differential input signal amplified by the amplifier circuit, and decide a value of the differential input signal by an output from the adder circuit.

22. An integrated circuit, comprising:
an amplifier circuit configured to amplify an input differential input signal and output the amplified differential input signal;
a decision circuit that comprises an adder circuit according to claim 19, the adder circuit being configured to add a signal based on a control input according to a value previously decided to the differential input signal amplified by the amplifier circuit, and decide a value of the differential input signal by an output from the adder circuit; and
an internal circuit configured to receives a signal related to the value decided by the decision circuit and perform processing operation.

23. An adder circuit, comprising:
a first current source that is connected to a power supply line to which a first electric potential is supplied;
a differential input circuit that is connected between the first current source and a first node and configured to receive a differential input signal;
a second current source that is connected between a power supply line to which a second electric potential different from the first electric potential is supplied and the first node;
a load circuit that is connected between the power supply line to which the first electric potential is supplied and the first node;
an inductor circuit that is connected between the first node and the second current source;
a third current source that is connected between the power supply line to which the second electric potential is supplied and the first node; and
a fourth current source that is connected between the power supply line to which the first electric potential is supplied and the first node, a current amount of the fourth current source changing according to a control input.

24. The adder circuit according to claim 23, wherein
a parasitic capacitor which is parasitic on the first node and an inductor of the inductor circuit constitute a parallel resonant circuit.

25. A reception circuit, comprising:
an amplifier circuit configured to amplify an input differential input signal and output the amplified differential input signal; and
a decision circuit that comprises an adder circuit according to claim 23, the adder circuit being configured to add a signal based on a control input according to a value previously decided to the differential input signal amplified by the amplifier circuit, and decide a value of the differential input signal by an output from the adder circuit.

26. An integrated circuit, comprising:
an amplifier circuit configured to amplify an input differential input signal and output the amplified differential input signal;
a decision circuit that comprises an adder circuit according to claim 10, the adder circuit being configured to add a signal based on a control input according to a value previously decided to the differential input signal amplified by the amplifier circuit, and decide a value of the differential input signal by an output from the adder circuit; and
an internal circuit configured to receive a signal related to the value decided by the decision circuit and perform processing operation.

* * * * *